United States Patent
Paton

(10) Patent No.: US 6,632,729 B1
(45) Date of Patent: Oct. 14, 2003

(54) LASER THERMAL ANNEALING OF HIGH-K GATE OXIDE LAYERS

(75) Inventor: Eric N. Paton, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/163,455

(22) Filed: Jun. 7, 2002

(51) Int. Cl.[7] .............................................. H01L 21/42
(52) U.S. Cl. ..................................................... 438/535
(58) Field of Search ................................ 438/535–536, 438/795, 799, 550

(56) References Cited

U.S. PATENT DOCUMENTS

| | | | | |
|---|---|---|---|---|
| 4,437,139 A | * | 3/1984 | Howard | 361/313 |
| 6,063,698 A | * | 5/2000 | Tseng et al. | 438/585 |
| 6,100,204 A | | 8/2000 | Gardner et al. | 438/765 |
| 6,187,632 B1 | | 2/2001 | Shuto et al. | 438/257 |

OTHER PUBLICATIONS

Baldus, O. et al., "Laser Annealing Studies of Barium Strontium NTitanate Thin Films using Short Laser Pulses" Integrated Ferroelectrics, 200, vol. 30, pp. 129–138.*

* cited by examiner

*Primary Examiner*—Craig Thompson

(57) ABSTRACT

A method of manufacturing a semiconductor device, comprising the steps of:
(a) providing a semiconductor substrate having a surface;
(b) forming a gate oxide layer on at least a portion of the surface and including an interface therewith, the gate oxide layer comprising a high-k dielectric oxide including a plurality of interface traps at the interface;
(c) forming a gate electrode layer on at least a portion of the gate oxide layer; and
(d) laser thermal annealing the high-k gate oxide layer to de-activate the interface traps without incurring formation of a low-k dielectric oxide layer at the interface.

15 Claims, 2 Drawing Sheets

LASER THERMAL ANNEALING OF HIGH-K GATE OXIDE LAYERS

FIELD OF THE INVENTION

The present invention relates generally to the manufacture of semiconductor devices which include a high-k dielectric gate oxide layer and semiconductor devices obtained thereby. More specifically, the present invention relates to an improved method for performing thermal annealing of high-k dielectric oxide layers and to MOSFET semiconductor devices obtained thereby.

BACKGROUND OF THE INVENTION

The performance of MOSFET-based semiconductor devices is improved by increasing the capacitance between the gate electrode and the underlying channel region within the semiconductor substrate. Typically, the capacitance is increased by decreasing the thickness of the gate dielectric layer, typically an oxide layer such as a silicon oxide, to below about 100 Å. Currently, silicon oxide, e.g., $SiO_2$, gate dielectric layer thicknesses are approaching about 40 Å or less. However, the utility of silicon oxide as a gate dielectric is severely limited at such reduced thicknesses, e.g., due to direct tunneling through the gate dielectric layer to the underlying channel region, thereby increasing the gate-to-channel leakage current and an increase in power consumption.

Inasmuch as further reduction in the silicon oxide gate dielectric thickness is impractical in view of the above increase in gate-to-channel leakage current, various approaches have been investigated for reducing the gate-to-channel leakage current while maintaining a thin $SiO_2$ "equivalent thickness", i.e., the thickness of a non-$SiO_2$ dielectric layer determined by multiplying a given $SiO_2$ thickness by the ratio of the dielectric constant of the non-$SiO_2$ dielectric to that of $SiO_2$, i.e., $k_{non-SiO2}/k_{SiO2}$. Thus, one approach which has been investigated is the use of materials with dielectric constants higher than that of silicon oxide materials as gate dielectric materials, whereby the "high-k" dielectric materials, i.e., materials with dielectric constants of about 5 or above, replace the conventional silicon oxide-based "low-k" dielectric materials with dielectric constants of about 4 or below. The increased capacitance k (or permittivity $\epsilon$) of the gate dielectric material advantageously results in an increase in the gate-to-channel capacitance, which in turn, results in improved device performance. Since the capacitance C is proportional to the permittivity $\epsilon$ of the gate dielectric material divided by the thickness t of the gate dielectric layer, it is evident that the use of a high-k (or high-$\epsilon$) material permits use of thicker gate dielectric layers, i.e., >40 Å, whereby both greater capacitance and device speed are obtained with less gate-to-channel leakage current.

Typically, high-k dielectric materials, i.e., with $k \geq 5$, suitable for use as gate dielectric layers in the manufacture of semiconductor devices, are formed with a physical thickness from about 40 to about 500 Å, typically 40–100 Å (or a $SiO_2$ equivalent thickness less than about 40 Å), and comprise metal and oxygen-containing material including at least one dielectric material selected from the group consisting of metal oxides, metal silicates, metal aluminates, metal titanates, metal zirconates, ferroelectric materials, binary metal oxides, and ternary metal oxides. Suitable metal oxides include aluminum oxide, hafnium oxide, zirconium oxide, lanthanum oxide, titanium oxide, tantalum oxide, tungsten oxide, cerium oxide, and yttrium oxide; suitable metal silicates include zirconium silicate, and hafnium silicate; suitable metal aluminates include hafnium aluminate and lanthanum aluminate; suitable metal titanates include lead titanate, barium titanate, strontium titanate, and barium strontium titanate; suitable metal zirconates include lead zirconate; and suitable ferroelectric and/or ternary metal oxides include PST ($PbSc_xTa_{1-x}O_3$), PZN ($PbZn_xNb_{1-x}O_3$), PZT ($PbZr_xTi_{1-x}O_3$), and PMN ($PbMg_xNb_{1-x}O_3$). Preferred methods for deposition of the high-k metal oxide layer include various chemical vapor deposition (CVD) methods and physical vapor deposition (PVD) methods such as sputtering, vacuum evaporation, etc.

However, the use of high-k metal oxide-based materials as gate dielectric layers for MOSFET semiconductor devices incurs a disadvantage in that such high-k dielectric materials inevitably are formed to contain a much greater number of bulk traps and interface traps (at the interface between the gate dielectric layer and the underlying semiconductor substrate) than gate dielectric layers comprising thermally grown, low-k $SiO_2$. In particular, the presence of traps at the interface between the high-k gate dielectric layer and the underlying semiconductor substrate decreases electron mobility in the channel region of the semiconductor substrate beneath the gate dielectric layer. The traps also adversely affect both the sub-threshold slope and threshold voltage ($V_t$) operation of the devices.

One approach for improving gate dielectric performance of high-k dielectrics is to limit the effects of the bulk and interface traps by post-dielectric deposition annealing for deactivating the traps, as by rapid thermal annealing (RTA). However, when annealing for trap deactivation is performed by RTA, the structure comprised of a semiconductor substrate, high-k gate dielectric oxide layer, and overlying gate electrode is maintained at an elevated temperature for a sufficiently long interval such that oxygen diffuses from the high-k dielectric oxide layer into the underlying semiconductor layer to form a layer of oxidized semiconductor material at the interface between the gate oxide layer and the semiconductor substrate. Illustratively, and with reference to FIG. 1, when the substrate is a silicon (Si) or Si-containing substrate, a low-k silicon oxide layer, typically a $SiO_2$ layer, is formed at the interface between the semiconductor substrate and the high-k gate oxide layer. The presence of the low-k $SiO_2$ layer beneath the high-k gate oxide layer disadvantageously increases the Effective Oxide Thickness (EOT) of the gate oxide layer, thereby mitigating the benefit attributable to the thin equivalent $SiO_2$ layer thickness provided by use of the high-k dielectric oxide layer.

Accordingly, there exists a need for improved methodology for performing simple, reliable, and rapid annealing of high-k dielectric oxide layers for trap deactivation, performed as part of a process sequence for the manufacture of high performance MOSFET-based semiconductor devices, e.g., NMOS and PMOS transistors and CMOS devices, which methodology avoids the drawbacks and disadvantages associated with the conventionally utilized RTA processing for trap deactivation and provides, inter alia, MOSFET devices with increased gate-to-channel capacitance and performance benefits/enhancements associated therewith.

The present invention, wherein annealing for deactivation of bulk and interface traps associated with gate dielectric layers composed of high-k dielectric oxide materials, e.g., metal oxides, is performed by a laser thermal annealing (LTA) process which eliminates, or at least substantially reduces, oxygen out-diffusion from the high-k dielectric oxide layer resulting in deleterious formation of a layer of low-k oxidized semiconductor material at the gate dielectric layer/semiconductor substrate interface, effectively addresses and solves the need for improved methodology for the manufacture of high performance MOSFET devices with increased gate-to-channel capacitance and performance benefits/enhancements associated therewith. Further, the methodology afforded by the present invention enjoys diverse utility in the manufacture of numerous and various types of semiconductor devices and/or components requiring the formation of high quality, low trap density, high-k dielectric oxide layers on semiconductor substrates.

DISCLOSURE OF THE INVENTION

An advantage of the present invention is an improved method for manufacturing a semiconductor device.

Another advantage of the present invention is an improved method for manufacturing a semiconductor device comprising a high-k dielectric oxide layer.

Yet another advantage of the present invention is an improved method for manufacturing a MOSFET semiconductor device including a gate oxide layer comprised of a high-k dielectric oxide.

Still another advantage of the present invention is an improved MOSFET semiconductor device including a gate oxide layer comprised of a high-k dielectric oxide.

Additional advantages and other aspects and features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to the invention, the foregoing and other advantages are obtained in part by a method of manufacturing a semiconductor device, comprising the steps of:

(a) providing a semiconductor substrate having a surface;

(b) forming a gate oxide layer on at least a portion of the surface of the semiconductor substrate and including an interface therewith, the gate oxide layer comprising a high-k dielectric oxide including a plurality of interface traps at the interface;

(c) forming a gate electrode layer on at least a portion of the gate oxide layer; and (d) thermal annealing the high-k dielectric gate oxide layer to de-activate the interface traps without incurring formation of a low-k dielectric oxide layer at the interface.

According to embodiments of the present invention, step (a) comprises providing a single crystal, polycrystalline, or amorphous silicon (Si) substrate, a silicon-on-insulator (SOI) substrate, a germanium (Ge) substrate, a silicon-germanium (Si—Ge) substrate, or a gallium arsenide (GaAs) substrate; and step (b) comprises forming a high-k gate oxide layer having a dielectric constant k of about 5 or greater.

In accordance with particular embodiments of the present invention, step (b) comprises forming a high-k gate oxide layer having a physical thickness from about 40 to about 100 Å, i.e., a SiO$_2$ equivalent thickness of less than about 40 Å.

According to certain embodiments of the present invention, step (b) comprises forming a high-k metal and oxygen-containing layer, e.g., comprising at least one dielectric material selected from the group consisting of metal oxides, metal silicates, metal aluminates, metal titanates, metal zirconates, ferroelectric materials, binary metal oxides, and ternary metal oxides. Thus, according to embodiments of the present invention, step (b) comprises forming a high-k metal oxide layer comprising at least one material selected from the group consisting of aluminum oxide, hafnium oxide, zirconium oxide, lanthanum oxide, titanium oxide, tantalum oxide, tungsten oxide, cerium oxide, yttrium oxide, zirconium silicate, hafnium silicate, hafnium aluminate, lanthanum aluminate, lead titanate, barium titanate, strontium titanate, barium strontium titanate, lead zirconate; ferroelectric oxides, ternary metal oxides, PST (PbSc$_x$Ta$_{1-x}$O$_3$), PZN (PbZn$_x$Nb$_{1-x}$O$_3$), PZT (PbZr$_x$Ti$_{1-x}$O$_3$), and PMN (PbMg$_x$Nb$_{1-x}$O$_3$).

Further embodiments of the present invention include forming a high-k gate oxide layer in step (b) which further includes bulk traps; and step (d) further comprises thermal annealing the high-k gate oxide layer to de-activate the bulk traps.

According to embodiments of the present invention, step (c) comprises forming a gate electrode layer comprising at least one electrically conductive material selected from the group consisting of metals, metal silicides, polysilicon, doped polysilicon, and amorphous silicon; and step (d) comprises performing thermal annealing without incurring formation of a low-k dielectric oxide layer having a dielectric constant k of about 4 or less, e.g., a silicon oxide layer.

In accordance with preferred embodiments of the present invention, step (d) comprises performing laser thermal annealing (LTA), e.g., step (d) comprises performing LTA utilizing a gas immersion laser process with an inert gas atmosphere and a laser wavelength from about 200 nm to about 1.25 µm and irradiation fluence from about 0.10 to about 1 Joule/cm$^2$ for an interval sufficient to anneal out defects in the gate oxide layer without incurring: (1) formation of a low-k dielectric oxide layer having a dielectric constant k of about 4 or less and (2) melting of the semiconductor substrate material and/or the gate electrode material.

According to further embodiments of the present invention, the method further comprises the steps of:

(e) patterning the gate electrode layer to form a gate electrode having a pre-selected width and a pair of opposing side edges;

(f) forming a pair of lightly-doped (LDD) source/drain extension regions in the semiconductor substrate by dopant ion implantation utilizing the gate electrode as an implantation mask;

(g) forming insulative sidewall spacers on each of the pair of opposing side edges of the gate electrode; and (h) forming a pair of heavier-doped source/drain regions in the semiconductor substrate by dopant ion implantation utilizing the gate electrode with the insulative sidewall spacers thereon as an implantation mask;

wherein step (d) is performed after performing step (h) in order to simultaneously activate the implanted dopant ions in the source/drain regions.

Another aspect of the present invention is a MOSFET semiconductor device including a gate oxide layer comprised of a high-k dielectric oxide which has been annealed to de-activate interface and/or bulk traps therein without incurring formation of a low-k dielectric oxide layer at an interface between the gate oxide layer and an underlying semiconductor substrate.

According to embodiments of the present invention, the MOSFET semiconductor device is fabricated by a process comprising the steps of:

(a) providing a semiconductor substrate having a surface;

(b) forming a gate oxide layer on at least a portion of the surface of the semiconductor substrate and including an interface therewith, the gate oxide layer comprising a high-k dielectric oxide including a plurality of interface traps and/or bulk traps therein;

(c) forming a gate electrode layer on at least a portion of the gate oxide layer;

(d) patterning the gate electrode layer to form a gate electrode having a pre-elected width and a pair of opposing side edges;

(e) forming a pair of lightly-doped (LDD) source/drain extension regions in the semiconductor substrate by dopant ion implantation utilizing the gate electrode as an implantation mask;

(f) forming insulative sidewall spacers on each of the pair of opposing side edges of the gate electrode;

(g) forming a pair of heavier-doped source/drain regions in the semiconductor substrate by dopant ion implantation utilizing the gate electrode with the insulative sidewall spacers thereon as an implantation mask; and (h) thermal annealing the structure formed in steps (a)–(g) to de-activate the interface and/or bulk traps without incurring formation of a low-k dielectric oxide layer at the interface and to simultaneously activate the implanted dopant ions in the source/drain regions.

In accordance with particular embodiments of the present invention, step (a) comprises providing a single crystal, polycrystalline, or amorphous silicon substrate, or a silicon-on-insulator (SOI) substrate, a germanium substrate, a silicon-germanium substrate, or a gallium arsenide substrate;

step (b) comprises providing a high-k gate oxide layer having a dielectric constant k of about 5 or greater, a physical thickness from about 40 to about 500 Å, a $SiO_2$ equivalent thickness less than about 40 Å, and comprised of a high-k metal and oxygen-containing layer including at least one dielectric material selected from the group consisting of metal oxides, metal silicates, metal aluminates, metal titanates, metal zirconates, ferroelectric materials, binary metal oxides, and ternary metal oxides;

step (c) comprises forming a gate electrode layer comprising at least one electrically conductive material selected from the group consisting of metals, metal silicides, polysilicon, doped polysilicon, and amorphous silicon; and step (h) comprises performing laser thermal annealing (LTA) without incurring formation of a low-k dielectric oxide layer having a dielectric constant k of about 4 or less.

Embodiments of the present invention include PMOS and/or NMOS transistors or CMOS devices.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, wherein.

DESCRIPTION OF THE INVENTION

Figure 1:
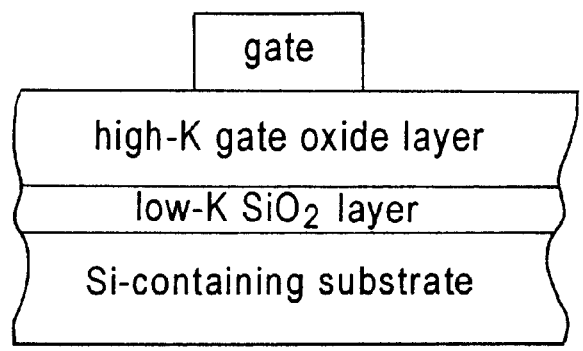
FIG. 1 is a schematic, simplified, cross-section of part of a MOSFET device fabricated according to conventional RTA methodology resulting in the formation of a low-k dielectric silicon oxide layer at the interface between a high-k gate oxide layer and an underlying Si-containing substrate.

The present invention is based upon the discovery that formation of high quality, high-k dielectric oxide layers, e.g., metal oxide dielectric layers with dielectric constant k≧5, suitable for use in the manufacture of semiconductor devices such as MOSFET transistors and CMOS devices, can be readily formed by a process which eliminates, or at least substantially reduces, formation of a layer of a low-k dielectric oxide at an interface between the high-k dielectric oxide and the underlying semiconductor substrate. A key feature of the present invention is the deactivation of bulk and/or interface traps inevitably formed in the high-k dielectric oxide layer by means of a thermal annealing process, e.g., laser thermal annealing (LTA), which reduces the interval during which the latter is at an elevated temperature, thereby substantially eliminating out-diffusion of oxygen species from the high-k dielectric oxide layer while effecting de-activation of the traps (and activation of source/drain implants). As a consequence of the use of LTA rather than the conventional rapid thermal annealing (RTA) methodology, the disadvantages and drawbacks arising from oxygen out-diffusion from the high-k dielectric oxide layer and resultant low-k dielectric oxide layer formation at the interface between the high-k dielectric oxide and the underlying semiconductor substrate are effectively avoided, whereby the goal of obtaining the desired advantageous performance characteristics associated with the use of high-k gate oxide layers is not compromised. A further advantage of the inventive methodology is full compatibility with all other aspects of the process step sequence for automated manufacture of MOSFET transistors and CMOS devices.

Referring to FIGS. 2–5, shown therein are schematic simplified, cross-sectional views illustrating stages in the formation of a MOSFET semiconductor device 10 according to an embodiment of the invention, wherein semiconductor substrate 12 is preferably a silicon (Si) wafer. However, substrate 12 may comprise any of a single crystal, polycrystalline, or amorphous silicon (Si) substrate, a silicon-on-insulator (SOI) substrate, a germanium (Ge) substrate, a silicon-germanium (Si—Ge) substrate, or a gallium arsenide (GaAs) substrate.

High-k dielectric layer 14 is formed on the upper surface of substrate 12, preferably by a lower temperature method such as a chemical vapor deposition (CVD) method or a physical vapor deposition method (PVD), e.g., sputtering or vacuum evaporation. The physical thickness of high-k dielectric layer 14 is on the order of 40–500 Å, typically 40–100 Å, corresponding to a $SiO_2$ equivalent thickness of about 40 or less (as determined by the ratio $k_{non-SiO2}/k_{SiO2}$ of the dielectric constant of the non-$SiO_2$ dielectric to that of $SiO_2$). Typical high-k materials with $k \geq 5$ suitable for use as high-k dielectric layer 14 include metal and oxygen-containing materials including at least one dielectric material selected from the group consisting of metal oxides, metal silicates, metal aluminates, metal titanates, metal zirconates, ferroelectric materials, binary metal oxides, and ternary metal oxides. Suitable metal oxides include aluminum oxide, hafnium oxide, zirconium oxide, lanthanum oxide, titanium oxide, tantalum oxide, tungsten oxide, cerium oxide, and yttrium oxide; suitable metal silicates include zirconium silicate, and hafnium silicate; suitable metal aluminates include hafnium aluminate and lanthanum aluminate; suitable metal titanates include lead titanate, barium titanate, strontium titanate, and barium strontium titanate; suitable metal zirconates include lead zirconate; and suitable ferroelectric and/or ternary metal oxides include PST ($PbSc_xTa_{1-x}O_3$), PZN ($PbZn_xNb_{1-x}O_3$), PZT ($PbZr_xTi_{1-x}O_3$), and PMN ($PbMg_xNb_{1-x}O_3$). Preferred methods for deposition of the high-k metal oxide layer include various chemical vapor deposition (CVD) methods and physical vapor deposition (PVD) methods such as sputtering, vacuum evaporation, etc.

Electrically conductive layer 20 for use as a gate electrode layer is formed in overlying relation with high-k metal oxide layer 14 at a thickness of about 2,000 Å, and is preferably comprised of a doped CVD polysilicon. Other electrically conductive materials suitable for use as layer 20 include metals, metal silicides, and amorphous silicon.

Figure 2:
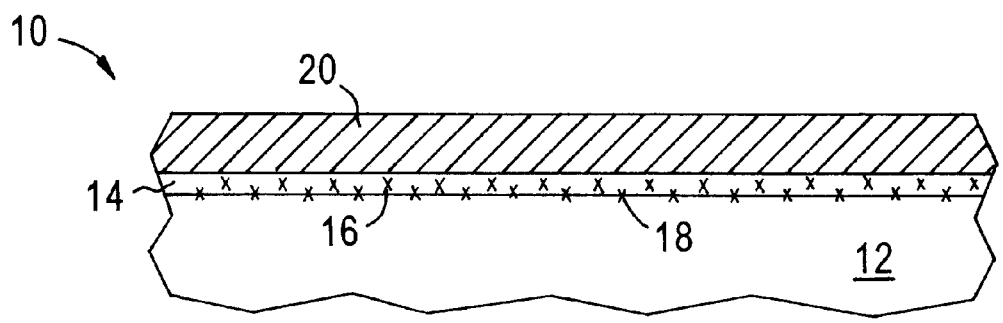
FIGS. 2–5 are schematic simplified, cross-sectional views illustrating stages in the formation of a MOSFET device according to an embodiment of the invention, wherein like reference numerals are employed throughout to designate similar features.

As shown in FIG. 2, the as-deposited, high-k metal oxide layer 14 contains a plurality of bulk traps 16 and interface traps 18 at the interface with the underlying semiconductor substrate 12, wherein traps 16 and 18 respectively comprise imperfect chemical bonds between atoms of layer 14 or at the atomic interface between substrate 12 and layer 14. Such traps are disadvantageous in general, and particularly disadvantageous and numerous in high-k dielectric materials because they readily trap charged particles (i.e., electrons and/or holes), whereby the threshold voltage ($V_t$) of the ultimately formed transistor can be adversely shifted or the sub-threshold slope characteristic of the transistor can be adversely altered. In addition, traps 16 and 18 can disadvantageously increase the leakage current between the electrically conductive gate electrode layer and the semiconductor substrate 12, thereby increasing power consumption and decreasing device performance.

Figure 3:
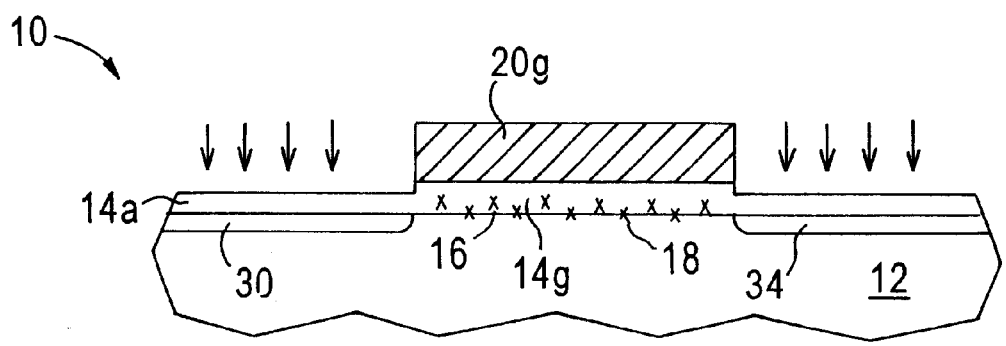

Adverting to FIG. 3, electrically conductive layer is patterned, as by conventional photolithographic masking and etching techniques not described herein for brevity, to define gate electrode 20g, during which patterning the unmasked portions of the high-k layer 14 are partly or entirely removed to leave high-k gate oxide layer portion 14g beneath and aligned with gate electrode 20g. Lightly-doped (LDD) source/drain extension regions 30 and 34 are then selectively formed in portions of substrate 12 not masked by gate electrode 20g, as by dopant ion implantation. By way of illustration, but not limitation, LDD source/drain extension regions 30 and 34 may be formed by implanting ions of an n-type dopant, e.g., As ions of about 5–30 KeV energy at a dosage from about $5\times10^{13}$ to about $8\times10^{14}$ ions/$cm^2$.

Figure 4:
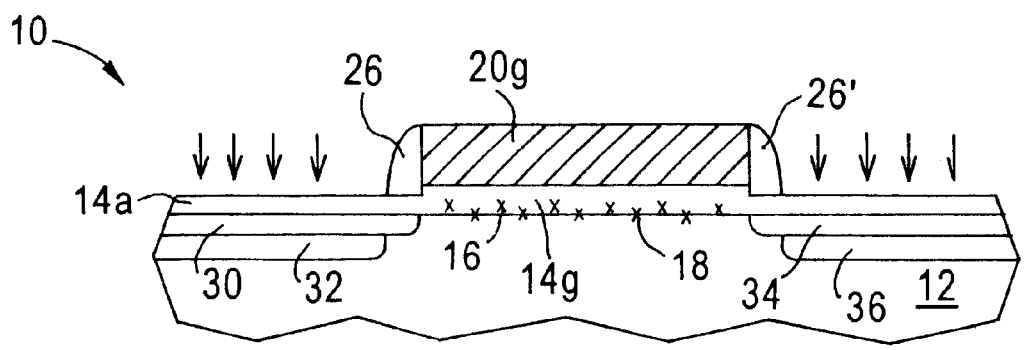

Referring now to FIG. 4, in the next steps according to the invention, dielectric sidewall spacers 26, 26' are formed on the high-k dielectric layer 14 adjacent the side edges of gate electrode 20g, as by conventional techniques comprising deposition of a blanket dielectric layer over the side and top surfaces of gate electrode 20g and the exposed surfaces of high-k dielectric layer 14, followed by anisotropic etching (preferably selective to the high-k dielectric layer 14) to remove unwanted portions of the blanket dielectric layer. Heavier doped source/drain regions 32 and 36 are then formed by ion implantation self-aligned to the sidewall spacers 26, 26'. By way of illustration, but not limitation, the heavier doped source/drain regions 32 and 36 may be formed by implanting ions of an n-type dopant, e.g., As ions of about 5–30 KeV energy at a dosage from about $2\times10^{15}$ to about $7\times10^{05}$ ions/$cm^2$.

Figure 5:
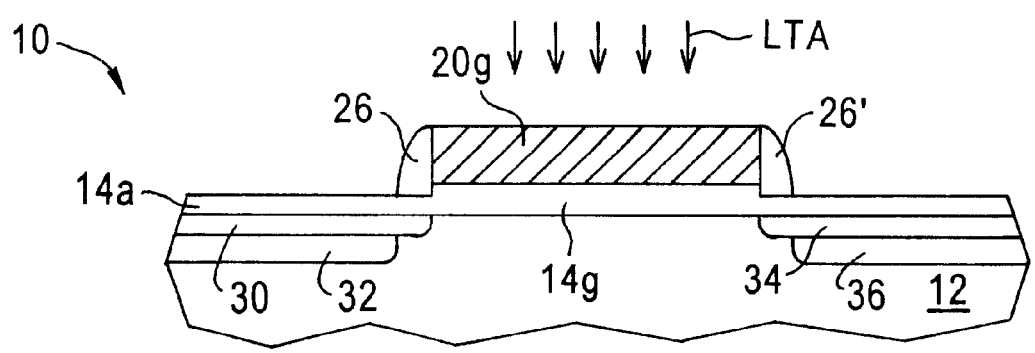

Referring now to FIG. 5, the thus-formed structure is subjected to thermal annealing to: (1) deactivate (i.e., effectively remove) the bulk and interface traps 16 and 18, present within the high-k gate oxide layer 14g and at the interface with substrate 12, respectively; and (2) activate the implanted dopant impurities in the LDD source/drain extension regions 30 and 32 and in the heavier-doped source/drain regions 32 and 36. According to the invention, instead of performing annealing by a conventional RTA process, wherein the structure is heated to about 900–1,100° C. for about 30–60 sec. in an inert ambient, the annealing is laser thermal annealing (LTA), e.g., performed with a gas immersion laser process utilizing an inert gas atmosphere and a laser wavelength from about 200 nm to about 1.25 μm and irradiation fluence from about 0.10 to about 1 Joule/$cm^2$ for an interval sufficient to anneal out defects in the gate oxide layer without incurring: (1) formation of a low-k dielectric oxide layer having a dielectric constant k of about 4 or less and (2) melting of the semiconductor substrate material and/or the gate electrode material.

The amount of laser energy supplied to the workpiece for annealing out defects in the high-k gate oxide layer varies with the particular gate material; determination of a particular set of laser irradiation parameters for a particular high-k gate oxide material is considered within the purview of one of ordinary skill. However, since it is not considered desirable to melt the semiconductor substrate material (e.g., Si) and/or the gate electrode material (e.g., metal, metal silicide, or polysilicon), the maximum temperature achieved during the irradiation interval is limited by the lower of their respective melting temperatures (1412° C. for crystalline Si). Another consideration is the reflectivity of the gate electrode material. For example, metal gate electrodes may reflect more laser energy than polysilicon-based gate electrodes.

By way of illustration only, a pulsed YAG laser operating at 532 nm and 20 nsec. pulses of fluence up to about 0.80–1 Joule/$cm^2$ may be utilized with polysilicon-based gate electrodes and Si substrates. On the other hand, a lower laser fluence of about 0.10–0.15 Joule/$cm^2$ is more appropriately used with SOI substrates in order to ensure that substrate melting does not occur during the LTA process. Multiple pulses may be required in some instances to effect sufficient heating of the high-k gate oxide layer to anneal out the defects therein. For example, 100 pulses of a 532 nm YAG laser operating at 100 Hz can be irradiated to the workpiece in one second. In addition to 532 nm YAG lasers, shorter wavelength lasers, e.g., XeCl excimer lasers operating at 308 nm and KrCl excimer laser operating at 222 nm, may also be utilized according to the invention;

however, such shorter wavelength lasers will have shallower absorption depths, i.e., about 200 Å vs. 10,000 Å for the 532 nm YAG laser. In such instances, the excimer lasers and lasers operating at even shorter wavelengths (e.g., KrF at 248 nm) may be utilized together with a frequency doubler or tripler to increase the absorption depth.

Other lasers which are usable according to the invention include single mode ruby lasers operating at 694 nm and those which supply laser energy of much longer wavelength, e.g., Nd:glass lasers operating at 1.06 µm. However, higher laser fluences are required to heat Si substrates at the longer wavelengths, since the absorption depth increases with wavelength.

According to the invention, when the MOSFET structure such as shown in FIG. 5 is annealed by LTA to deactivate traps in the high-k gate oxide layer and activate implanted dopant impurities in the source/drain regions, the interval during which the structure is maintained at the elevated temperature necessary for annealing is reduced compared to the interval when annealing is performed in conventional manner, i.e., by RTA. Accordingly, very little oxygen out-diffusion from the high-k gate oxide layer occurs during the reduced interval at high temperature, and as a consequence, oxidation of the underlying semiconductor substrate at the interface with the high-k gate oxide layer to form an unwanted, undesirable low-k dielectric oxide layer beneath the high-k gate oxide layer, is suppressed. As a result of the inventive methodology, the improvements in device performance sought by substitution of the high-k gate oxide layer with its very thin $SiO_2$ equivalent thickness are not mitigated by the formation of a low-k dielectric layer beneath the high-k gate dielectric layer. Thus, the process according to the present invention yields high performance, low power consumption MOSFET transistors, CMOS devices, etc., wherein a high quality, defect-free, high-k gate dielectric layer is formed with a corresponding thin $SiO_2$ equivalent layer thickness, without formation of an undesired low-k dielectric oxide intermediate the high-k gate dielectric layer and the underlying substrate.

The present invention thus enables reliable formation of defect-free, high-quality, high-k gate insulator layers for use in all manner of semiconductor devices, including MOS transistors and CMOS devices. In addition, the inventive methodology enjoys utility in the manufacture of numerous other devices requiring high quality, high-k dielectric layers, e.g., thin-film capacitors. Moreover, the invention can be practiced by use of conventional methodologies and instrumentalities at rates consistent with the throughput requirements of automated manufacturing processes and is fully compatible with conventional process flow for the manufacture of high-density integration semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing a semiconductor device, comprising the steps of:
   (a) providing a semiconductor substrate having a surface;
   (b) forming a gate oxide layer on at least a portion of said surface of said semiconductor substrate and including an interface therewith, said gate oxide layer comprising a high-k dielectric oxide including a plurality of interface traps at said interface;
   (c) forming a gate electrode layer on at least a portion of said gate oxide layer; and
   (d) laser thermal annealing (LTA) said high-k dielectric gate oxide layer to de-activate said interface traps without incurring formation of a low-k dielectric oxide layer at said interface.

2. The method as in claim 1, wherein:
step (a) comprises providing a single crystal, polycrystalline, or amorphous silicon (Si) substrate, a silicon-on-insulator (SOI) substrate, a germanium (Ge) substrate, a silicon-germanium (Si—Ge) substrate, or a gallium arsenide (GaAs) substrate.

3. The method as in claim 1, wherein:
step (b) comprises forming a high-k gate oxide layer having a dielectric constant k of about 5 or greater.

4. The method as in claim 3, wherein:
step (b) comprises forming a high-k gate oxide layer having a physical thickness from about 40 to about 100 Å.

5. The method as in claim 3, wherein:
step (b) comprises forming a high-k gate oxide layer having a $SiO_2$ equivalent thickness of less than about 40 Å.

6. The method as in claim 3, wherein:
step (b) comprises forming a high-k gate oxide layer comprising at least one metal and an oxygen-containing material.

7. The method as in claim 6, wherein:
step (b) comprises forming a high-k metal oxide layer comprising at least one metal and oxygen-containing material selected from the group consisting of metal oxides, metal silicates, metal aluminates, metal titanates, metal zirconates, ferroelectric materials, binary metal oxides, and ternary metal oxides.

8. The method as in claim 7, wherein:
step (b) comprises forming a high-k metal oxide layer comprising at least one material selected from the group consisting of aluminum oxide, hafnium oxide, zirconium oxide, lanthanum oxide, titanium oxide, tantalum oxide, tungsten oxide, cerium oxide, yttrium oxide, zirconium silicate, hafnium silicate, hafnium aluminate, lanthanum aluminate, lead titanate, barium titanate, strontium titanate, barium strontium titanate, lead zirconate; ferroelectric oxides, ternary metal oxides, PST ($PbSc_xTa_{1-x}O_3$), PZN ($PbZn_xNb_{1-x}O_3$), PZT ($PbZr_xTi_{1-x}O_3$), and PMN ($PbMg_xNb_{1-x}O_3$).

9. The method as in claim 3, wherein:
step (b) comprises forming a high-k gate oxide layer which further includes bulk traps; and
step (d) further comprises thermal annealing the high-k gate oxide layer to de-activate said bulk traps.

10. The method as in claim 1, wherein:
step (c) comprises forming a gate electrode layer comprising at least one electrically conductive material selected from the group consisting of metals, metal silicides, polysilicon, doped polysilicon, and amorphous silicon.

11. The method as in claim 1, wherein:
step (d) comprises performing thermal annealing without incurring formation of a low-k dielectric oxide layer having a dielectric constant k of about 4 or less.

12. The method as in claim 11, wherein:

step (d) comprises performing thermal annealing without incurring formation of a low-k silicon oxide layer.

13. The method as in claim 1 wherein:

step (d) comprises performing LTA utilizing a gas immersion laser process with an inert gas atmosphere and a laser wavelength from about 200 nm to about 1.25 $\mu$m and irradiation fluence from about 0.10 to about 1 Joule/cm$^2$ for an interval sufficient to anneal out defects in the gate oxide layer without incurring: (1) formation of a low-k dielectric oxide layer having a dielectric constant k of about 4 or less and (2) melting of the semiconductor substrate material and/or the gate electrode material.

14. The method as in claim 1, further comprising the steps of:

(e) patterning said gate electrode layer to form a gate electrode having a pre-selected width and a pair of opposing side edges; and (f) forming a pair of lightly-doped (LDD) source/drain extension regions in said semiconductor substrate by dopant ion implantation utilizing said gate electrode as an implantation mask.

15. The method as in claim 14, further comprising the steps of:

(g) forming insulative sidewall spacers on each of said pair of opposing side edges of said gate electrode; and (h) forming a pair of heavier-doped source/drain regions in said semiconductor substrate by dopant ion implantation utilizing said gate electrode with said insulative sidewall spacers thereon as an implantation mask;

wherein step (d) is performed after performing step (h) in order to simultaneously activate the implanted dopant ions in said source/drain regions.

* * * * *